United States Patent
Hwang et al.

(10) Patent No.: US 9,494,616 B2
(45) Date of Patent: Nov. 15, 2016

(54) SOCKET DEVICE FOR TESTING SEMICONDUCTOR DEVICE

(71) Applicant: HICON CO., LTD., Gyeonggi-do (KR)

(72) Inventors: Dong Weon Hwang, Seoul (KR); Jae Suk Hwang, Berkeley, CA (US); Jae Baek Hwang, Seoul (KR)

(73) Assignees: HICON CO., LTD., Seongnam-si, Gyeonggi-do (KR); Dong Weon Hwang, Seoul (KR); Jae Suk Hwang, Berkeley, CA (US); Jae Baek Hwang, Seoul (KR)

( * ) Notice: Subject to any disclaimer, the term of this patent is extended or adjusted under 35 U.S.C. 154(b) by 0 days.

(21) Appl. No.: 14/768,029

(22) PCT Filed: Dec. 6, 2013

(86) PCT No.: PCT/KR2013/011283
§ 371 (c)(1),
(2) Date: Aug. 14, 2015

(87) PCT Pub. No.: WO2014/208840
PCT Pub. Date: Dec. 31, 2014

(65) Prior Publication Data
US 2015/0377924 A1    Dec. 31, 2015

(30) Foreign Application Priority Data

Jun. 28, 2013 (KR) .................. 10-2013-0075093

(51) Int. Cl.
*G01R 31/00*    (2006.01)
*G01R 1/04*    (2006.01)
(Continued)

(52) U.S. Cl.
CPC .......... *G01R 1/0466* (2013.01); *G01R 31/2601* (2013.01); *G01R 31/2863* (2013.01); *G01R 1/0483* (2013.01)

(58) Field of Classification Search
CPC ............ G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| 5,807,104 A | * | 9/1998 | Ikeya | .................. G01R 1/0483 324/756.02 |
| 6,267,603 B1 | | 7/2001 | Yamamoto et al. | |

(Continued)

FOREIGN PATENT DOCUMENTS

| JP | 04-198875 A | 7/1992 |
| JP | 09-197004 A | 7/1997 |

(Continued)

OTHER PUBLICATIONS

Japanese Office Action dated Aug. 2, 2016.

*Primary Examiner* — Tung X Nguyen
(74) *Attorney, Agent, or Firm* — Rabin & Berdo, P.C.

(57) ABSTRACT

The present invention relates to a socket device for testing a semiconductor device. More particularly, the present invention relates to a socket device that is capable of testing ball grid array (BGA) and land grid array (LGA) type semiconductor devices, or BGA/LGA hybrid semiconductor devices according to the shapes of leads of the semiconductor devices. A latch structure for pressing and holding a semiconductor device is improved such that a roller is provided at the front end of a latch so as to minimize wear caused by friction with a sandpaper-like surface on an upper surface of the semiconductor device, even in the case of approximately one hundred thousand or more rounds of testing, thereby remarkably extending the life of the socket device, increasing testing efficiency, and reducing costs.

7 Claims, 8 Drawing Sheets

(51) Int. Cl.
  *G01R 31/26* (2014.01)
  *G01R 31/28* (2006.01)

(56) References Cited

U.S. PATENT DOCUMENTS

| | | |
|---|---|---|
| 6,283,780 B1 | 9/2001 | Yamamoto et al. |
| 7,828,575 B2 | 11/2010 | Hwang |
| 7,874,863 B1 | 1/2011 | Hwang |
| 7,918,679 B2 | 4/2011 | Hwang |
| 2001/0023140 A1* | 9/2001 | Saijo .............. G01R 1/045 439/71 |
| 2009/0275220 A1 | 11/2009 | Hwang |
| 2011/0021056 A1 | 1/2011 | Hwang |
| 2011/0028019 A1 | 2/2011 | Hwang |

FOREIGN PATENT DOCUMENTS

| | | |
|---|---|---|
| JP | 11-297443 A | 10/1999 |
| JP | 2003-007417 A | 1/2003 |
| JP | 2003-168532 A | 6/2003 |
| JP | 2004-063107 A | 2/2004 |
| JP | 2009-037927 A | 2/2009 |
| JP | 2009-250917 A | 10/2009 |
| JP | 2012-242332 A | 12/2012 |
| KR | 10-2006-0069947 A | 6/2006 |
| KR | 10-2010-0133078 A | 12/2010 |
| KR | 10-2011-0085710 A | 7/2011 |
| KR | 10-2012-0013028 A | 2/2012 |

* cited by examiner (a)

(b)

(c)

SOCKET DEVICE FOR TESTING SEMICONDUCTOR DEVICE

TECHNICAL FIELD

The present invention generally relates to a socket device for testing a semiconductor device. More particularly, the present invention relates to a socket device that is capable of testing ball grid array (BGA) and land grid array (LGA) type semiconductor devices, or BGA/LGA hybrid semiconductor devices according to the shapes of leads of the semiconductor devices.

BACKGROUND ART

In general, a test board or a burn-in board is provided with a socket device for testing a semiconductor device (IC). Input and output leads of the board (a test board, a burn-in board) are connected to the burn-in chamber or a peripheral device thereof or an extra test device so that power and electrical signals may be input or output for operating the IC and for measuring characteristics of the IC. That is, the socket device for a semiconductor device is used in a system for a series of IC tests.

Among widely used general ICs, a BGA type IC remarkably reduces the size and thickness of the IC by arranging leads of the IC, or balls on the whole surface of the IC.

Recently, the pitch between balls of the BGA type IC has decreased from 0.5 mm to 0.4 mm to 0.35 mm, etc., and the number of used balls has increased to two hundred to five hundred to several thousands.

An LGA type IC is an IC without having balls on a pad (or a land) in the BGA type IC.

In recent years, the LGA type IC and the BGA/LGA hybrid IC have been available in a variety of forms, and a socket for testing the LGA type IC or the hybrid type IC is provided with a plurality of contacts having predetermined vertical elasticity, and the lower leads of the contacts are connected to a printed circuit board (PCB) by contacting or soldering.

Here, the upper leads of the contacts are provided such that the upper leads of the contacts contact the leads of the semiconductor device loaded in a socket, and for achieving electrically safe contact, the socket is provided with a pressing device for pressing down the IC.

For reference, when an external force applied by the pressing device on the upper surface of the semiconductor device is divided by the number of contacts, a physical force applied to one contact is calculated.

More specifically, a physical force applied to one contact is roughly 20 gf. For example, when the number of leads in the IC is two hundred, it is estimated that a physical force of about 4.0 kgf is required to be applied to the semiconductor device.

Accordingly, a socket for testing the IC is provided with a latch capable of effectively applying a powerful external force as described above to the IC. The socket for testing the semiconductor device is provided with extra power and reliable contacts enabling stable signal transfer.

FIGS. 1(a), (b), and (c) are a plan view, a side sectional view, and a bottom view of a BGA/LGA hybrid IC, respectively.

Referring to FIGS. 1(a), (b), and (c), an upper surface of the semiconductor device 1 is provided with fine protrusions 2 similar to the surface of sandpaper. The central part of a lower surface of the semiconductor device is provided with a plurality of balls 3 as leads of the semiconductor device. Land (or pad) type leads 4 are arrayed on an area outside of the plurality of balls 3, which result in manufacturing the BGA/LGA hybrid IC.

Currently, such hybrid-lead type ICs are being developed and are produced in various forms. Thus, a variety of socket devices is necessary for testing such ICs.

Particularly, in case of the BGA/LGA hybrid IC, a BGA part and an LGA part may be sometimes tested separately, but urgently needed is the development of a socket device that enables simultaneous testing of the BGA part and the LGA part.

The total number of leads in the BGA/LGA hybrid IC is about two hundred. It is necessary that the contacts for testing the LGA part, which run upward from below the semiconductor device, come in contact with leads (a pad or a land) beneath the semiconductor device. Furthermore, in this case, it is necessary that the socket device be provided with a device for pressing down the semiconductor device, wherein the pressing-down force should be equal to or higher than a total force all the contacts may sustain.

FIGS. 2(a) and (b) are a top plan view of a socket device for testing the semiconductor device according to a related art and a sectional view taken along line A-A of FIG. 2(a), respectively.

Referring to FIGS. 2(a) and (b), the related art socket device 10 for testing an LGA type IC includes a socket body 11 provided with a plurality of curved contacts 12, a socket cover 13 moving vertically above the socket body 11, and a latch 14 combined with the socket body 11 that can rotate so as to hold or release the LGA type IC 20 while operating in cooperation with vertical movements of the socket cover 13.

The latch 14 is provided with a guide slot 14a, and a guide pin 15a is engaged with the guide slot 14a. The guide pin 15a is coupled to a driving link 15, one end of which is hinged on the socket cover 13. The latch 14 is elastically biased by a coil spring 16.

When the socket cover 13 is pressed in the related art socket device, the latch 14 opens outward and the semiconductor device may be loaded. When the socket cover 13 is free from the pressing, due to a restoring force of the coil spring 16, the latch 14 presses down and holds the upper surface of the semiconductor device.

In the related art socket device, the front end of the latch presses and holds the upper surface of the semiconductor device by applying strong force. This step is performed repeatedly with each new test. As the upper surface of the semiconductor device is rough, when the front end of the latch is used repeatedly over a period of time, the front end of the latch in contact with the semiconductor device wears out more and more as the number of the tests increases. As a result, the electrical contact between the leads of the semiconductor device and the contacts becomes unstable, and thus reliability of the test decreases.

When tested about fifty thousand times, the front end of the latch wears out and thus malfunctions.

In the related art socket device for testing the LGA type IC, it is required to arrange and assemble contacts with the additional parts required in putting together the contacts having a bow-type curved section. The number of the parts is great, so assembly thereof is difficult. The related art socket device is also required to be provided with a structure for pressing to hold the semiconductor device with a strong force, and with a driving device, which results in a complex structure of the socket device. Particularly, due to the complex structure of the socket device, the price of the socket device increases and overall quality of the socket device decreases.

RELATED ART DOCUMENT

[Patent Document 1] Korean Patent Application Publication No. 10-2006-0069947 (published on Jun. 23, 2006)
[Patent Document 2] Korean Patent Application Publication No. 10-2011-0085710 (published on Jul. 27, 2011)

DISCLOSURE

Technical Problem

To improve the related art socket device for testing a semiconductor device, the present invention is intended to propose a socket device for testing a semiconductor device, which can test a ball grid array (BGA) type semiconductor device and a land grid array (LGA) type semiconductor device, or a BGA/LGA hybrid semiconductor device, and which can simplify the structure of a latch for pressing and holding the semiconductor device and the structure of a driving device, and can minimize wear of the latch structure caused by repeated contacts with the semiconductor device.

Technical Solution

To address the technical problem, the present invention provides a socket device for testing a semiconductor device including: a socket body provided with a plurality of first receiving holes for receiving a plurality of contacts therein, respectively, and provided with a hinge pin with which a latch is combined; a lower plate provided inside a lower part of the socket body wherein the lower plate is provided with a plurality of second receiving holes communicating with the first receiving holes so that lower contact portions of the contacts electrically contact leads of a printed circuit board (PCB); a floating plate supported by a plurality of elastic materials at a position above the socket body so that the floating plate can move vertically, wherein an upper surface of the floating plate serves as a surface to seat a semiconductor device, wherein the floating plate is provided with a plurality of through holes so that upper contact portions of the contacts go through the floating plate to be held in the plurality of through holes; a plurality of contacts inserted into the first receiving holes and the second receiving holes, wherein the lower contact portions of the contacts contact the leads of the PCB, and the upper contact portions of the contacts go through the through holes to contact leads of the semiconductor device; a guide plate provided on the floating plate, the guide plate having an inclined guide surface so that the semiconductor device can be seated on the floating plate; a socket cover supported by a plurality of cover springs, the socket cover combined together by a plurality of hooks with the socket body so as to move vertically above the socket body, and the socket cover having a plurality of latch driving pins and an opening so that the semiconductor device is led along the inclined guide surface to be loaded on the floating plate; and a latch elastically supported by a torsion spring and rotating on the hinge pin, the latch comprising a latch arm applying pressure to an upper surface of the semiconductor device, a roller capable of rotating freely at a front end of the latch arm, and a cam integral to the latch arm, the cam contacting the latch driving pins.

The floating plate according to the present invention may receive ball leads of the semiconductor device on a seating surface thereof, wherein the socket device is provided with a side guide wall that guides a seated position of the semiconductor device.

It is preferred that the present invention further includes an adapter block into which a plurality of adapter contacts electrically contacting respective lower ends of the contacts are inserted, the adapter block being provided with a first engaging means in an upper side thereof so that the lower part of the socket body can be engaged with the adapter block, and being provided with a second engaging means in an underside thereof so that the PCB can be engaged with the adapter block.

Preferably, according to the present invention, the contacts are composed of two or more different kinds.

Preferably, according to the present invention, each of the contacts includes an upper contact portion and a lower contact portion, which are elastically connected by a spring.

Preferably, according to the present invention, each of the contacts includes an upper contact portion and a lower contact portion, which are integral to a curved body or a coiled body.

Preferably, according to the present invention, the lower contact portion of each of the contacts comes in contact with the PCB by soldering.

Advantageous Effects

The socket device for testing the semiconductor device according to the present invention is capable of testing ball grid array (BGA) and land grid array (LGA) type semiconductor devices or a BGA/LGA hybrid semiconductor device according to the shapes of the leads of the semiconductor devices. Further, a latch structure for pressing and holding the semiconductor device is improved such that a roller is provided at a front end of the latch so as to minimize wear caused by friction with a sandpaper-like surface on the upper surface of the semiconductor device, even in the case of approximately one hundred thousand or more rounds of testing, thereby remarkably extending the life of the socket device, increasing testing efficiency, and reducing costs.

Figure 1:
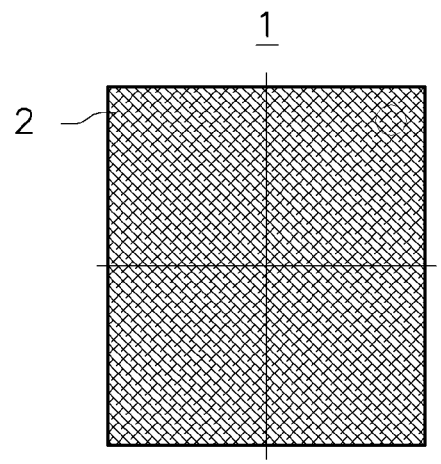
FIGS. 1(a), (b), and (c) are a plan view, a side sectional view, and a bottom view of a BGA/LGA hybrid IC, respectively.
Figure 1:
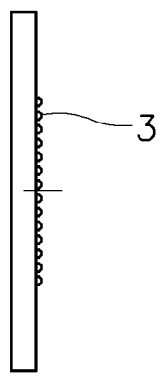
Figure 1:
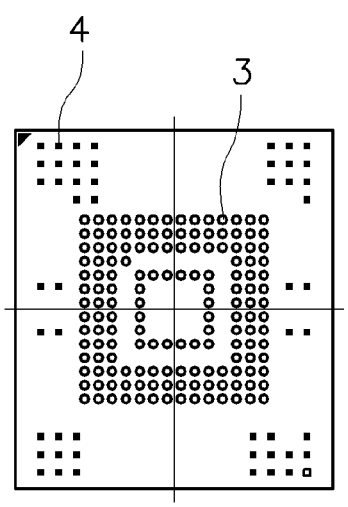
Figure 2:
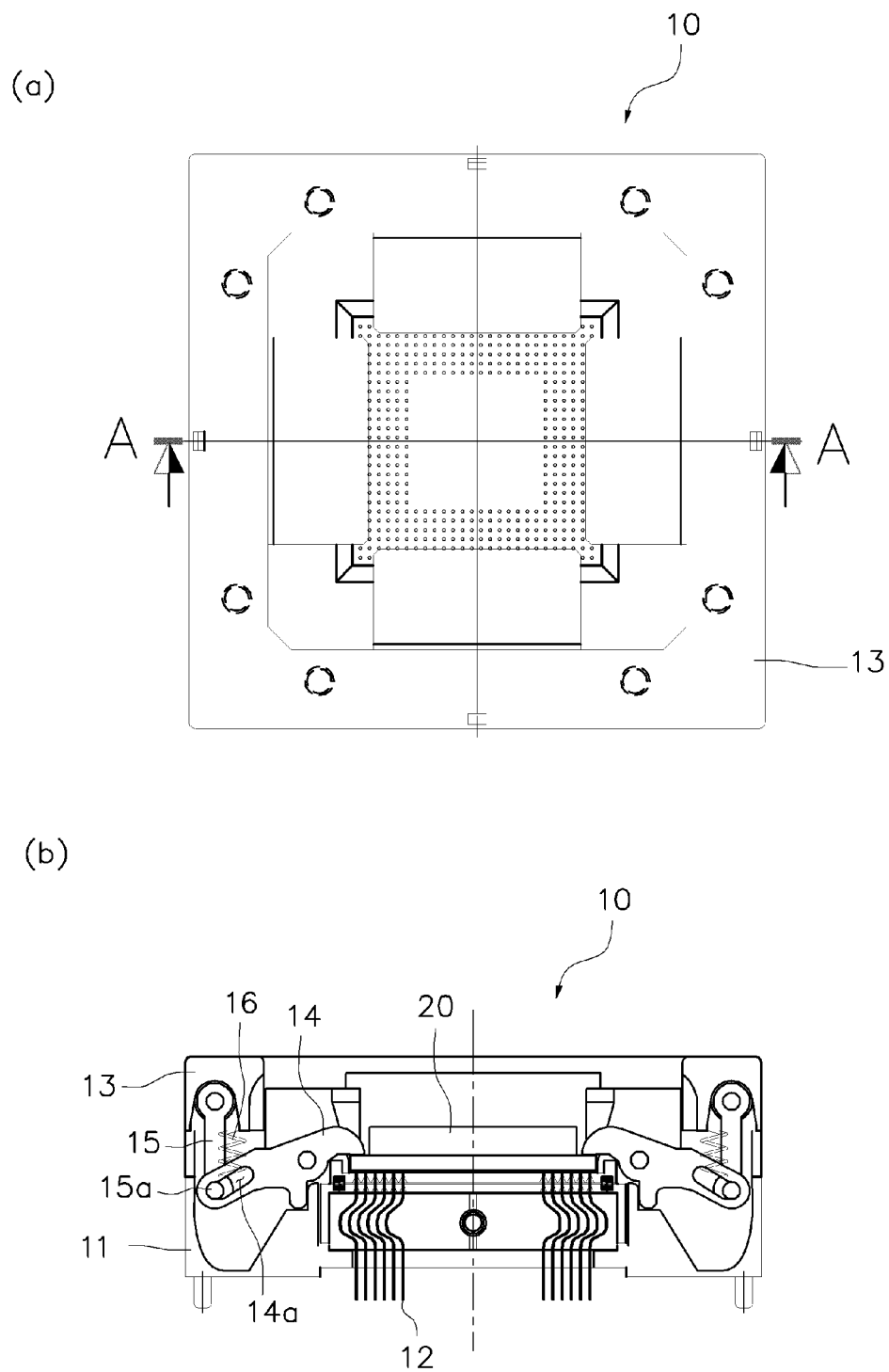
FIGS. 2(a) and (b) are a plan view of a socket device for testing a semiconductor device according to the related art and a sectional view taken along line A-A of FIG. 2(a), respectively.

<Description of the Reference Numerals in the Drawings>

C1: BGA type contact
1: Semiconductor device
C2: LGA type contact
100: Socket device -continued <Description of the Reference Numerals in the Drawings>

| | |
|---|---|
| 110: Socket body | 111: First receiving hole |
| 112: Hinge pin | 113: positioning pin |
| 120: Lower plate | 121: Second receiving hole |
| 130: Floating plate | 131: Elastic material |
| 132: Through hole | 133: Guide side wall |
| 140: Guide plate | 141: Guide inclined surface |
| 150: Socket cover | 151: Cover spring |
| 152: Hook | 153: Latch driving pin |
| 160: Latch | 161: Latch arm |
| 162: Roller | 163: Cam |
| 164: Torsion spring | 170: Adapter block |
| 171: Adapter contact | 172: Second positioning pin |

BEST MODE

Terms or words used in this specification and claims should not be limited to a meaning in normal practice or in a common dictionary, and should be interpreted in the meaning and concept which corresponds to the spirit of the art of the present invention, based on the principle that an inventor may properly define the concept of terms in order to describe the invention in the best mode.

Accordingly, the embodiments written in the specification and the configuration illustrated in the drawings are only preferred embodiments of the present invention, and are not representative of all sprits in the art of the present invention. Thus, it should be appreciated that the present invention may be replaced with a variety of equivalents and variations as of the filing date of the present invention.

Hereinafter, an exemplary embodiment of the present invention is described in detail with reference to the accompanying drawings.

Figure 3:
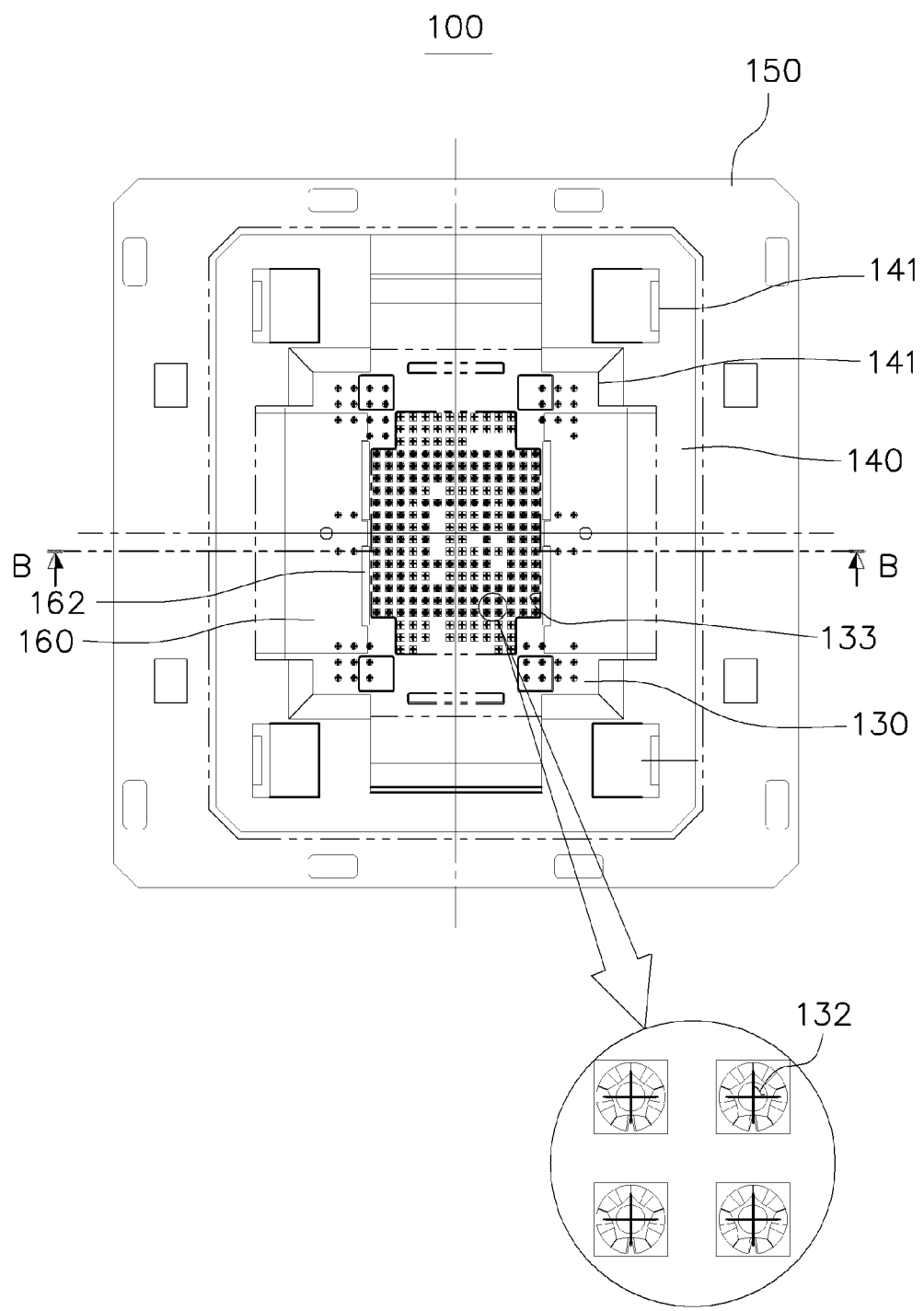
FIG. 3 is a plan view of a socket device according to the present invention.
Figure 4:
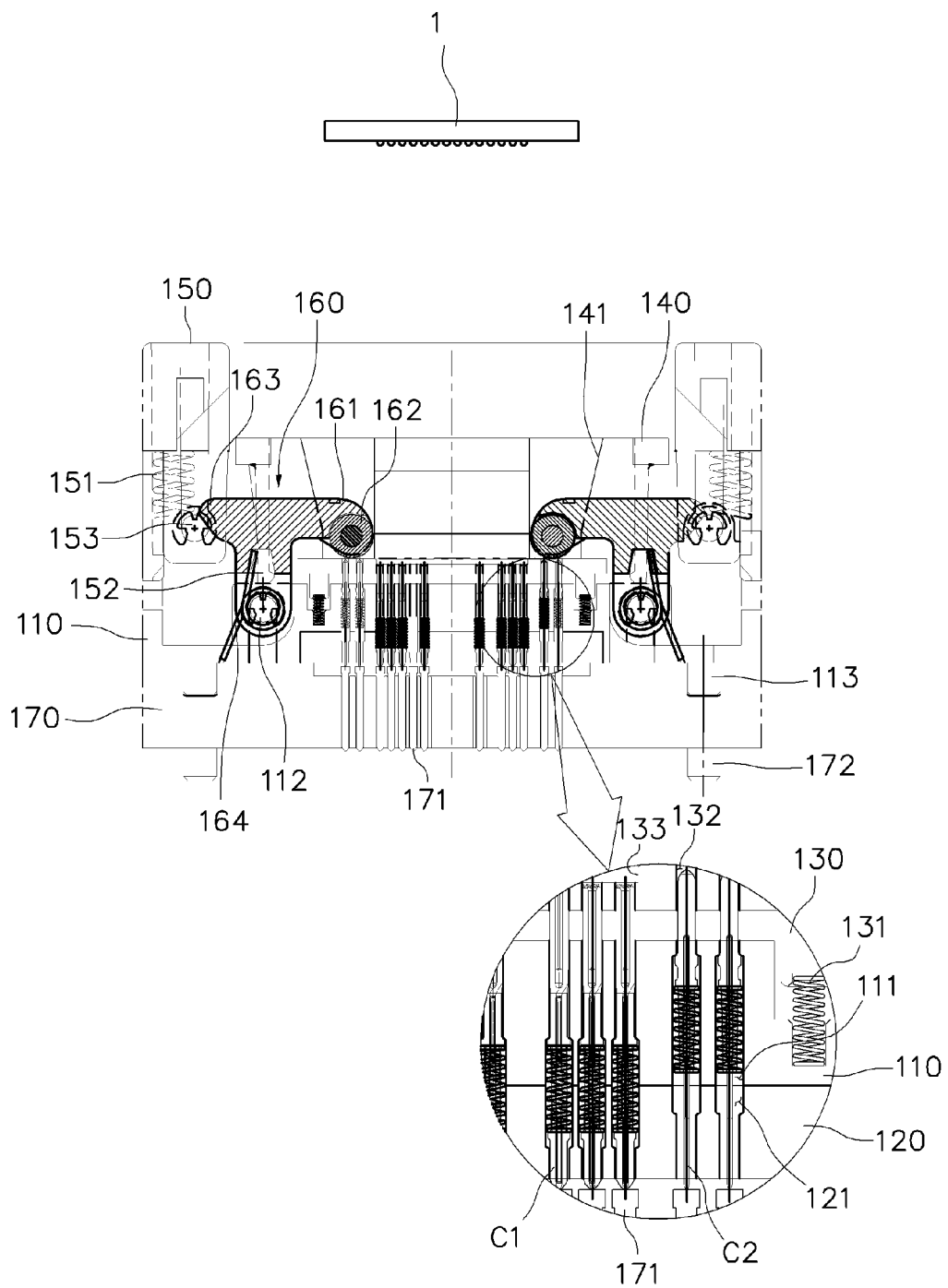
FIG. 4 is a sectional view taken along line B-B of FIG. 3.

Referring to FIGS. 3 and 4, a socket device 100 of the present invention includes a socket body 110 as a main body, a lower plate 120, a floating plate 130, contacts C1 and C2, a guide plate 140, a socket cover 150, and a latch 160.

The socket body 110 has a plurality of receiving holes 111 so that the plurality of contacts C1 and C2 are inserted into the receiving holes 111, respectively, thereby being held in the receiving holes 111. The socket body 110 is also provided with a hinge pin 112 to which the latch 160 is rotatably mounted.

A plurality of positioning pins 113 as an engaging means may protrude from a lower part of the socket body 110. An adapter block 170 may be provided with engaging holes at locations corresponding to the positioning pins 113, so the socket body 110 and the adapter block 170 may be combined with each other by the engagement of the positioning pins 113 with the respective engaging holes.

In the embodiment, the positioning pins 113 protrude from the socket body 110 and the adapter block 170 is provided with engaging holes corresponding to the respective positioning pins 113. But conversely, it is possible that the socket body 110 is provided with the engaging holes and the positioning pins 113 protrude from the adapter block 170, so the socket body 110 and the adapter block 170 may be combined together.

Though not shown, the socket body may be provided with a plurality of nuts or bolt holes, so that a PCB may be bolted to the socket body. In the present invention, the contacts C1 and C2 may be composed of at least two or more different kinds. For example, there are a BGA type contact C1 contacting a ball type lead of a semiconductor device and an LGA type contact C2 contacting a pad (or a land) type lead of a semiconductor device. The BGA contact or the LGA contact may include various types of contacts such as spring contacts or pogo pins where an upper contact portion and a lower contact portion of the spring contact or the pogo pin are elastically connected by a spring, or an integrated contact where an upper contact portion and a lower contact portion are integral to a curved or coiled body.

The lower contact portions of the contacts may contact the PCB by soldering.

A lower plate 120 is provided inside the lower part of the socket body 110, and there are a plurality of first receiving holes 111 and a plurality of second receiving holes 121 provided, which communicate with each other, so that lower contact portions of the contacts C1 and C2 may be brought into electric contact with the leads of the PCB.

A floating plate 130 is elastically supported by a plurality of elastic materials 131 in the socket body 110 so that the floating plate 130 may move vertically, and the semiconductor 1 may be seated on an upper surface of the floating plate 130. Multiple through holes 132 are formed in the floating plate 130 so that upper contact portions of the contacts C1 and C2 go through the through holes 132 to be set, enabling the upper contact portions of the contacts C1 and C2 to electrically contact leads of the semiconductor device 1.

Preferably, ball type leads of the semiconductor device 1 are received on the upper surface of the floating plate 130 on which the semiconductor device 1 is seated, and side guide walls 133 leading to the seating place of the semiconductor device 1 are formed.

The guide plate 140 provided over the floating plate 130 is provided with an inclined guide surface 141 so that the semiconductor device 1 may be efficiently seated on the floating plate 130.

The Socket cover 150 is provided with an opening at the center thereof so that the semiconductor device 1 is led along the inclined guide surface 141 to be loaded. The Socket cover 150 is elastically supported by a plurality of cover springs 151 so as to move vertically above the socket body 110. The Socket cover 150 is provided with a plurality of hooks 152, and the hooks 152 are coupled to protrusions of the socket body 110, so that the socket cover 150 moves vertically relative to the socket body 110 within a range of a predetermined stroke.

The socket cover 150 is provided with a plurality of latch driving pins 153, and in keeping with a vertical movement of the socket cover 150, the latch is rotated by the latch driving pins 153.

The latch 160 elastically supported by a torsion spring 164 turns on the hinge pin 112 in the socket body 110. The latch 160 includes a latch arm 161 applying pressure to a surface of the semiconductor device, a roller 162 provided at a front end of the latch arm 161 to rotate freely, and a cam 163 integral to the latch arm 161, the cam 163 contacting the latch driving pin 153.

Figure 5:
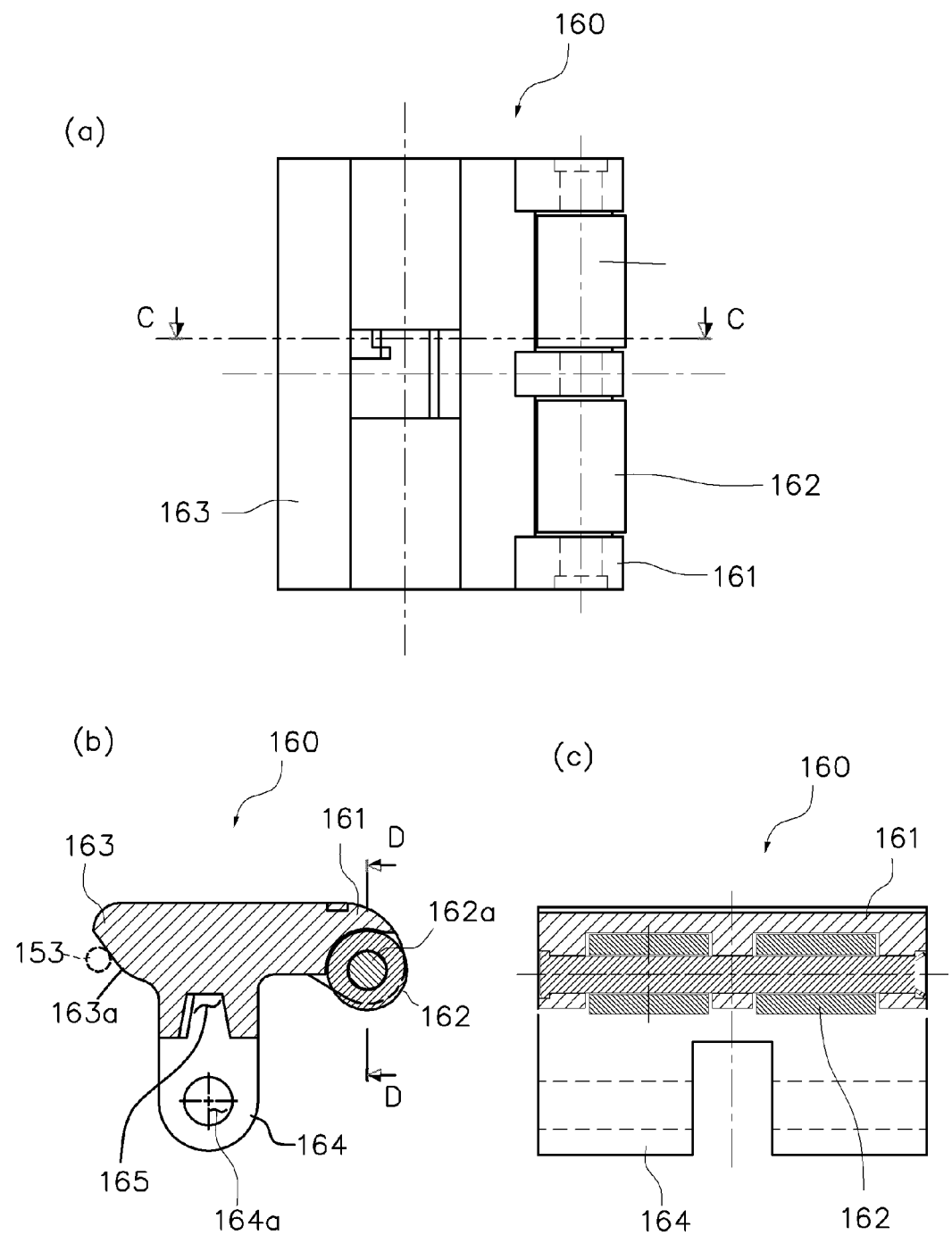
FIGS. 5(a), (b), and (c) are a bottom view, a sectional view taken along line C-C, and a sectional view taken along line D-D of a latch in the socket device according to the present invention, respectively.

FIGS. 5(a), (b), and (c) are a bottom view of the latch of the socket device of the present invention, a cross-sectional view taken along line C-C, and a cross-sectional view taken along line D-D, respectively.

Referring to FIGS. 5(a), (b), and (c), in the latch 160, the latch arm 161, the cam 163, and a hinge arm 164 are integrally formed. The latch arm 161 is parallel to the cam 163, and the hinge arm 164 is roughly vertical to the latch arm 161 and the cam 163.

The front end of the latch arm 161 is provided with two rollers 162 that are rotated freely by two roller pins 162a.

The number of the rollers may increase or decrease depending on width of the latch arm.

The cam 163 has a section of a predetermined curved surface 163a, and the section of curved surface 163a contacts the latch driving pin 153. In accordance with the height of the socket cover, the latch driving pin 153 moves vertically, by which the cam 163 is pressed, thereby the latch 160 rotates.

The hinge arm 164 is provided with a hinge hole 164a that is combined with the hinge pin 112 provided in the socket body.

The latch 160 has a stop depression 165 into which one end of the torsion spring is inserted. The torsion spring elastically supports the latch 160 in a direction (in an open direction) such that the latch 160 is opened outwards.

As described above, the adapter block 170 may further be provided under the socket body 110. A plurality of adapter contacts 171 electrically contacting respective lower ends of the contacts C1 and C2 are inserted in the adapter block 170. The adapter block 170 may be used to control or adjust the height of a seating surface for the semiconductor device or the height of the socket device.

Beneath the adapter block 170, a second positioning pin 172 as an engaging means may protrude so as to be engaged with a PCB. In addition, the adapter block also may be further provided with bolt holes (not shown) for bolting the socket device to the PCB.

The following is an operation example of the present invention configured as described above.

Figure 6:
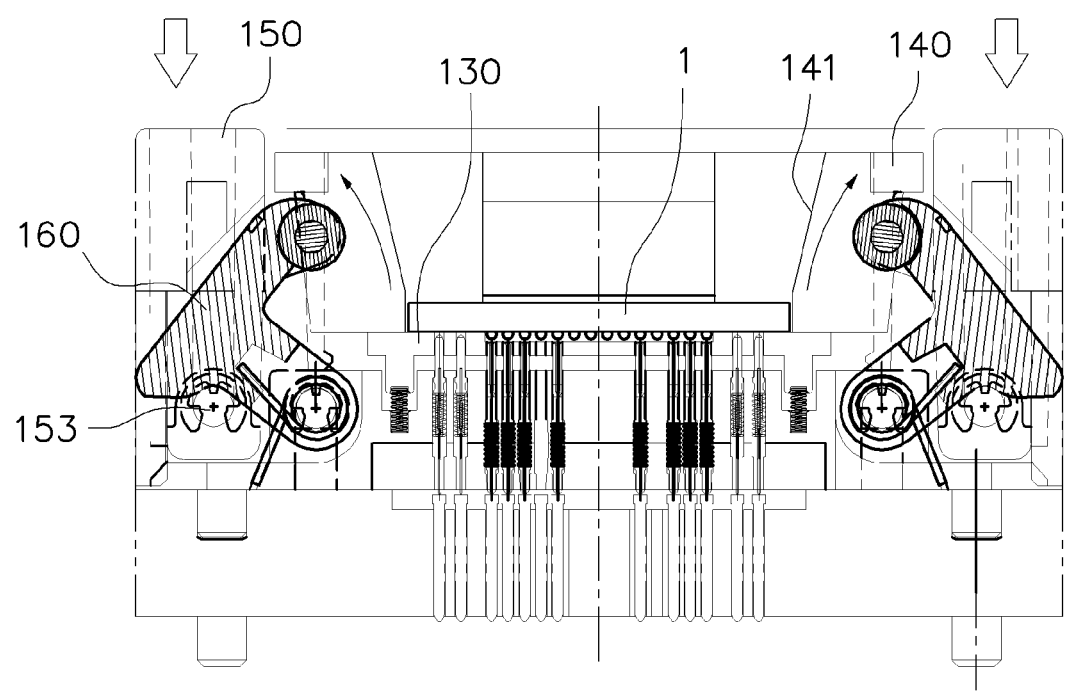
FIG. 6 is a view illustrating the socket device according to the present invention loaded with a semiconductor device.

FIG. 6 is a view illustrating the socket device according to the present invention loaded with a semiconductor device.

Referring to FIG. 6, when the socket cover 150 is pressed, the latch driving pin 153 is lowered, so the latch 160 is opened outwards by a restoring force of the torsion spring 164. Next, when the semiconductor device 1 is lowered from a position above the socket device, the semiconductor device 1 is guided along the inclined guide surface 141 of the guide plate 140 and is seated on the upper surface of the floating plate 130. In this case, the semiconductor device 1 is positioned in the correct position by the guide side wall 133 (see FIG. 4). Accordingly, each of the leads of the semiconductor device 1 corresponds to an associated contact.

Figure 7:
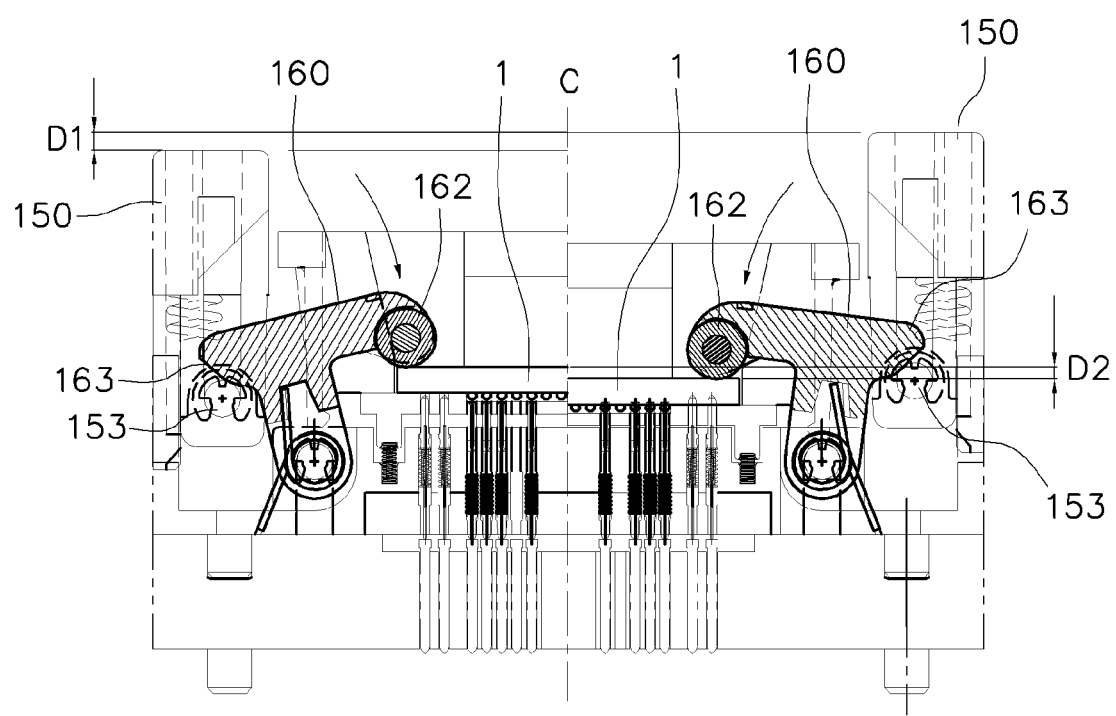
FIG. 7 is a view illustrating an operation of the latch with the semiconductor device loaded in the socket device according to the present invention.

FIG. 7 shows an operation example of the latch 160 with the semiconductor device 1 loaded on the socket device according to the present invention. The left of a center line C shows the time when the roller 162 of the latch 160 starts to press the upper surface of the semiconductor device 1. The right of the center line C illustrates the time when the socket cover 150 further moves upwards and the roller 162 of the latch 160 completely presses the semiconductor device 1.

When the socket cover 150 returns by a distance D1, the latch driving pin 153 of the socket cover 150 further pushes up the cam 163 depending on the restored distance. Then, the latch 160 rotates in a direction that the latch 160 is closed, and the roller 162 rolls on the upper surface of the semiconductor device 1 and presses the upper surface of the semiconductor device 1 by a distance D2. By rolling on the upper surface of the semiconductor device 1, the roller 162 may minimize wear by friction caused when the roller 162 presses a rough surface of the semiconductor device 1.

Figure 8:
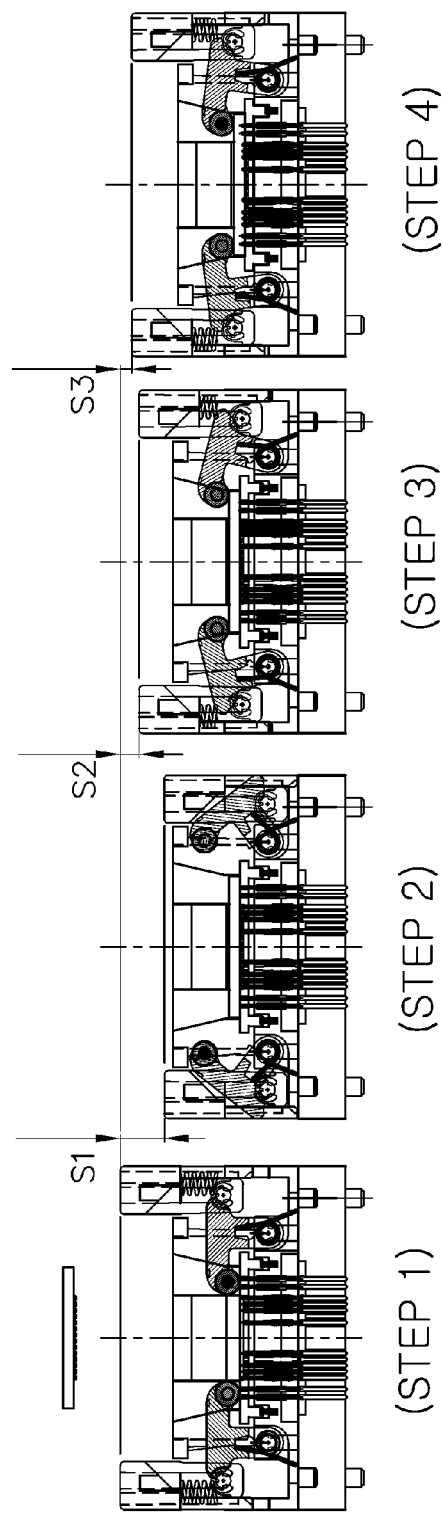
FIG. 8 is a view illustrating an operation of the socket device in sequence according to the present invention.

FIG. 8 sequentially shows an operation of the socket device of the present invention.

Step 1 is an initial stage, step 2 is to open the latch and load the semiconductor device by pressing the socket cover, and step 3 is the time when the socket cover returns, to some degree, to an original position of the socket cover, so that the roller of the latch starts to press the upper surface of the semiconductor device. From this time, the roller of the latch rolls on and presses the upper surface of the semiconductor device, so that the contacts come into contact with the lower leads of the semiconductor device, thereby performing the test for the semiconductor device.

When the number of contacts in a socket is two hundreds, and the force of each contact is 20 gf, the pressing force of the roller of the latch pressing the semiconductor device typically is equal to or higher than 4 kgf. While applying a pressing force of 4 kgf to the sandpaper-like upper surface of the semiconductor device, the roller of the latch provided in the socket of the present invention rolls on the upper surface of the semiconductor device, so that even when tested equal to or more than one hundred thousand times, the roller minimizes wear caused by friction with the sandpaper-like upper surface of the semiconductor device, thereby remarkably extending the life of the socket device, increasing test efficiency, and reducing costs.

Though the present invention is described by limited embodiments and drawings, the present invention is not limited to this and may be modified or changed by those skilled in the art within the spirit of the art of the present invention and the range of the claims below.

What is claimed is:

1. A socket device for testing a semiconductor device, comprising:
   a socket body provided with a plurality of first receiving holes for receiving a plurality of contacts therein, respectively, and provided with a hinge pin with which a latch is combined;
   a lower plate provided inside a lower part of the socket body wherein the lower plate is provided with a plurality of second receiving holes communicating with the first receiving holes so that lower contact portions of the contacts electrically contact leads of a printed circuit board (PCB);
   a floating plate supported by a plurality of elastic materials at a position above the socket body so that the floating plate can move vertically, wherein an upper surface of the floating plate serves as a surface to seat a semiconductor device, wherein the floating plate is provided with a plurality of through holes so that upper contact portions of the contacts go through the floating plate to be held in the plurality of through holes;
   a plurality of contacts inserted into the first receiving holes and the second receiving holes, wherein the lower contact portions of the contacts contact the leads of the PCB, and the upper contact portions of the contacts go through the through holes to contact leads of the semiconductor device;
   a guide plate provided on the floating plate, the guide plate having an inclined guide surface so that the semiconductor device can be seated on the floating plate;
   a socket cover supported by a plurality of cover springs, the socket cover combined together by a plurality of hooks with the socket body so as to move vertically above the socket body, and the socket cover having a plurality of latch driving pins and an opening so that the semiconductor device is led along the inclined guide surface to be loaded on the floating plate; and
   a latch elastically supported by a torsion spring and rotating on the hinge pin, the latch comprising a latch arm applying pressure to an upper surface of the semiconductor device, a roller capable of rotating freely at a front end of the latch arm, and a cam integral to the latch arm, the cam contacting the latch driving pins.

2. The socket device for testing the semiconductor device of claim 1, wherein the floating plate receives ball leads of the semiconductor device on a seating surface thereof, wherein the socket device is provided with a side guide wall that guides a seating position of the semiconductor device.

3. The socket device for testing the semiconductor device of claim 1, further comprising an adapter block into which a plurality of adapter contacts electrically contacting respective lower ends of the contacts are inserted, the adapter block being provided with a first engaging means in an upper side thereof so that the lower part of the socket body can be engaged with the adapter block, and being provided with a second engaging means in an underside thereof so that the PCB can be engaged with the adapter block.

4. The socket device for testing the semiconductor device of claim 1, wherein the contacts comprise two or more different kinds.

5. The socket device for testing the semiconductor device of claim 1, wherein each of the contacts includes an upper contact portion and a lower contact portion, which are elastically connected by a spring.

6. The socket device for testing the semiconductor device of claim 1, wherein each of the contacts includes an upper contact portion and a lower contact portion, which are integral to a curved body or a coiled body.

7. The socket device for testing the semiconductor device of claim 1, wherein the lower contact portion of each of the contacts makes contact with the PCB by soldering.

* * * * *